United States Patent
Inutsuka et al.

(10) Patent No.: US 6,336,268 B1
(45) Date of Patent: Jan. 8, 2002

(54) ELECTRONIC PART MOUNTING MACHINE

(75) Inventors: Ryoji Inutsuka; Wataru Hirai, both of Osaka; Muneyoshi Fujiwara, Katano; Kunio Ohe, Hirakata; Yoshiyuki Nagai, Toyonaka; Hideo Sakon, Takatsuki, all of (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 0 days.

(21) Appl. No.: 09/355,749

(22) PCT Filed: Feb. 4, 1998

(86) PCT No.: PCT/JP98/00456

§ 371 Date: Nov. 1, 1999

§ 102(e) Date: Nov. 1, 1999

(87) PCT Pub. No.: WO98/34454

PCT Pub. Date: Aug. 6, 1998

(30) Foreign Application Priority Data

Feb. 4, 1997 (JP) .............................. 9-021558

(51) Int. Cl.[7] ................................ H05K 3/30
(52) U.S. Cl. .............................. 29/833; 29/740; 29/832
(58) Field of Search .......................... 29/740, 743, 832, 29/739

(56) References Cited

U.S. PATENT DOCUMENTS

| | | | | |
|---|---|---|---|---|
| 5,033,185 A | * | 7/1991 | Hidese | |
| 5,084,962 A | * | 2/1992 | Takahashi et al. | |
| 5,224,262 A | * | 7/1993 | Takaichi et al. | |
| 5,544,411 A | * | 8/1996 | Kano et al. | |
| 5,579,572 A | * | 12/1996 | Kasiwagi et al. | |
| 5,661,239 A | * | 8/1997 | Takeuchi | |
| 5,692,293 A | * | 12/1997 | Igarashi et al. | |
| 6,088,911 A | * | 7/2000 | Isogai et al. | |
| 6,195,878 B1 | * | 5/2001 | Hata et al. | |

FOREIGN PATENT DOCUMENTS

| | | |
|---|---|---|
| JP | 7-15181 | 1/1995 |
| JP | 8-32292 | 2/1996 |

* cited by examiner

*Primary Examiner*—Carl J. Arbes
(74) *Attorney, Agent, or Firm*—McDermott, Will & Emery (57) ABSTRACT

It is an object of the invention to suck the central position of an electronic part precisely, and enhance the successful suction rate of electronic parts. To achieve the object, the central position of the suction opening 14 provided in the nozzle tip end 13 for sucking an electronic part is deviated from the central position of rotation of the nozzle tip end 13 by a specified amount, and the rotation amount of the nozzle tip end 13 and the positioning position of the part supply portion are controlled.

10 Claims, 6 Drawing Sheets

Fig. 6    PRIOR ART

ELECTRONIC PART MOUNTING MACHINE

TECHNICAL FIELD

The present invention relates to an electronic part mounting machine for mounting an electronic part on a substrate.

BACKGROUND ART

Figure 5:
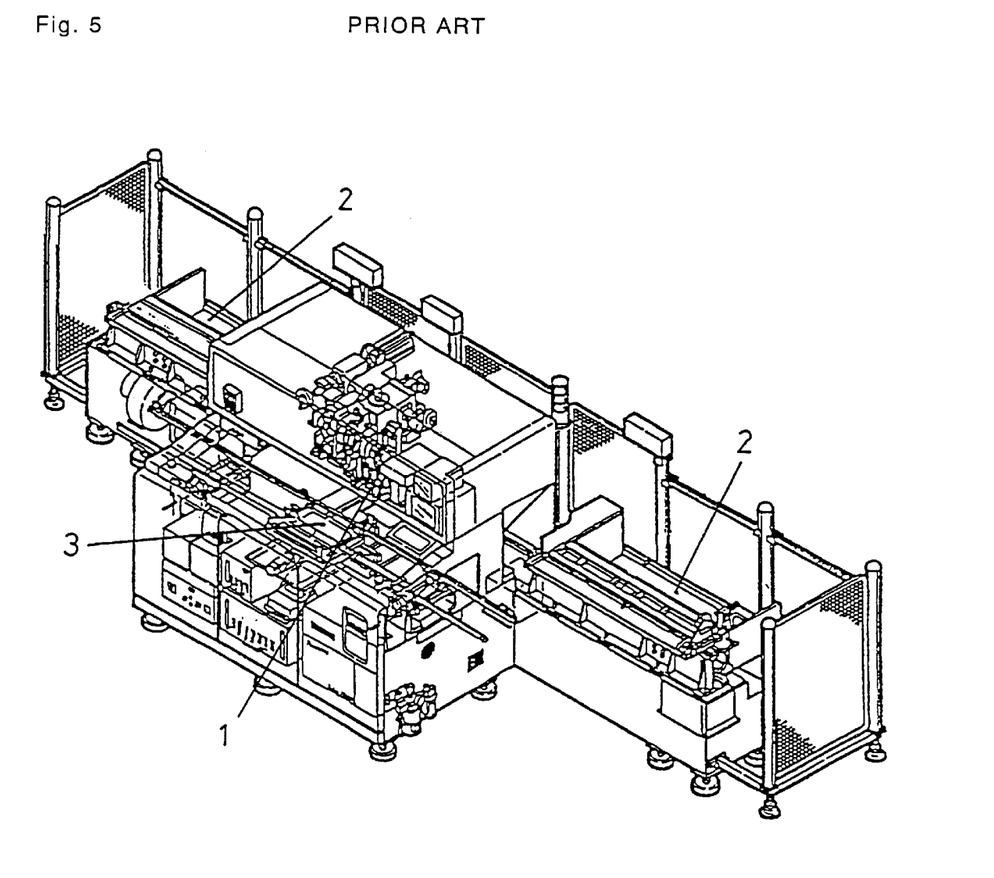
FIG. 5 is a perspective view showing a constitution of a conventional electronic part mounting machine.
Figure 6:
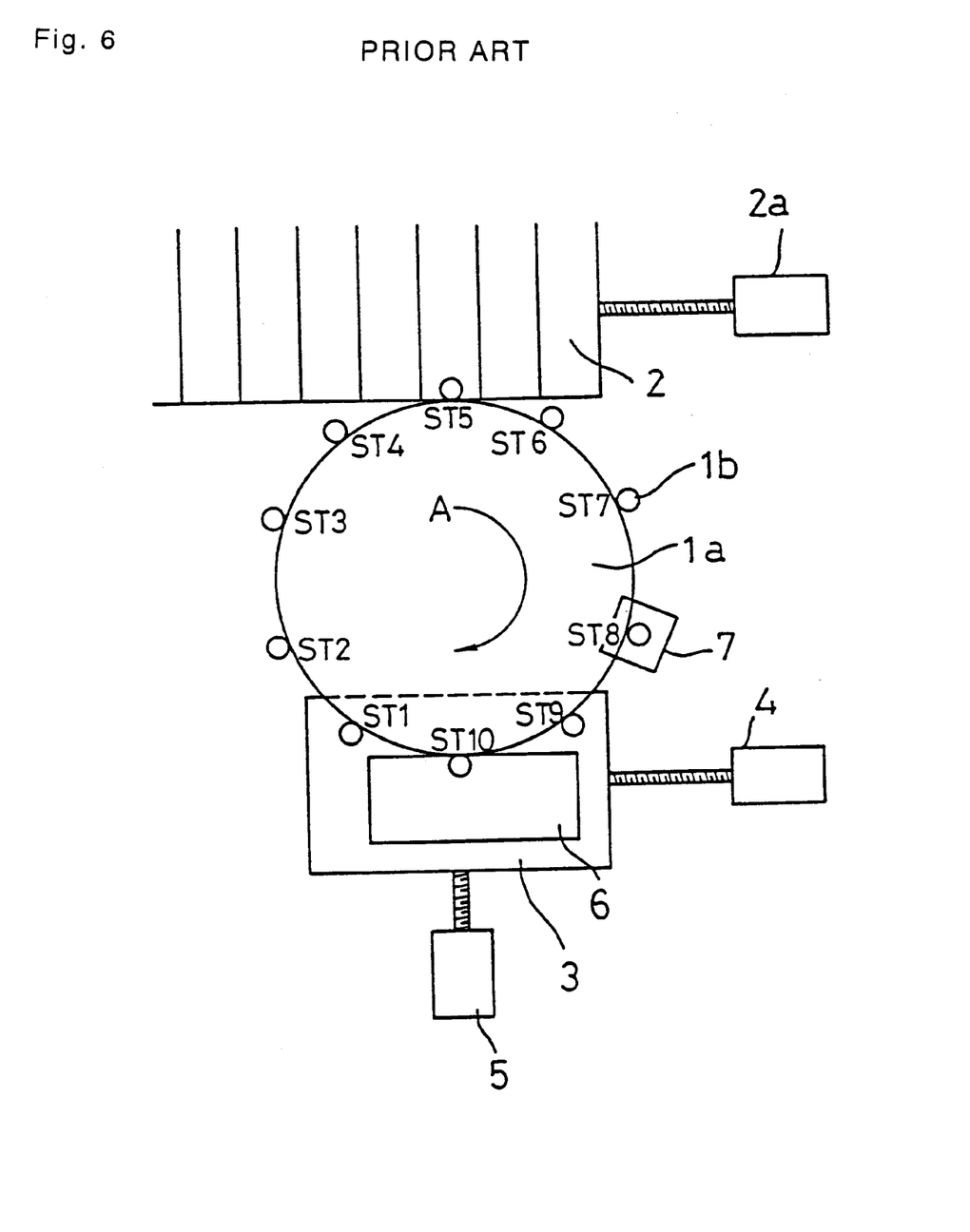
FIG. 6 is a plan view showing a concept of a conventional electronic part mounting machine.

A conventional electronic part mounting machine of this type was composed as shown in a perspective view in FIG. 5. In FIG. 5, reference numeral 1 is a mounting head having plural suction nozzles disposed on its circumference, for sequentially passing through the suction nozzles by means of an intermittent rotary drive unit disposed thereon, 2 is a part supply portion having plural parts feeders, for positioning the electronic parts to be mounted sequentially at suction positions of the suction nozzles, and 3 is an X-Y table conveying a substrate for mounting electronic parts on, for positioning sequentially so that the electronic parts may be mounted on preset mounting positions on the substrate. FIG. 6 is a plan view showing a concept of the electronic part mounting machine. Reference numeral 1a is a rotary head, 1b is a suction nozzle, 2a is a drive motor, 4 is an X-axis motor, 5 is a Y-axis motor, 6 is a substrate, and 7 is an image recognition portion.

In this prior art, an example of operation is described below while referring to FIG. 6. The rotary head 1a has ten suction nozzles 1b, that is, first station (ST1) to tenth station (ST10), and each suction nozzle 1b rotates intermittently in the direction of arrow A in FIG. 6. The part supply portion 2 mounting plural types of electronic parts is driven and positioned by the drive motor 2a, and positions the electronic part to be sucked next beneath the suction nozzle 1b at the position of the fifth station (ST5) shown in FIG. 6. At the position of the fifth station (ST5), the electronic part is sucked by the specified nozzle tip end in the suction nozzle 1b. The suction nozzle 1b sucking the electronic part rotates the electronic part to the mounting angle to the substrate preset by a mounting program, at the position of the sixth station (ST6). Then, at the position of the eighth station (ST8), the image recognition portion 7 detects the position of the sucked electronic part at the time of sucking, and the suction is corrected by rotation by correction rotating operation at the position of the ninth station (ST9). Finally, at the position of the tenth station (ST10), it operates to mount the electronic part by positioning to the mounting position preset by the mounting program, on the substrate 6 mounted on the X-Y table 3 positioned by the X-axis motor 4 and Y-axis motor 5.

However, in the electronic part mounting machine of such constitution, the central position of the suction opening provided at the nozzle tip end for sucking the electronic part coincides with the position of center of rotation of the nozzle tip end. Accordingly, if deviation of the central position of the electronic part to be sucked and the central position of the suction opening of the nozzle tip end is predicted beforehand, there is no other means for correcting the deviation of position than the means for positioning the part supply portion, and it was not always guaranteed to be sucked at the central position of the electronic part.

The invention is intended to solve the problems of the prior art, and it is hence an object thereof to present a part mounting machine for setting the central position of the suction opening provided at the nozzle tip end for sucking the electronic part at a position deviated from the position of the center of rotation of the nozzle tip end by a specified amount, and controlling the rotating amount of the nozzle tip end and the positioning position of the part supply portion so as to suck the central position of the electronic part precisely, thereby enhancing the suction rate of electronic parts.

SUMMARY OF THE INVENTION

To achieve the object, the electronic part mounting machine of the invention is an electronic part mounting machine for correcting the position of suction of the electronic part, and mounting the electronic part at a specified position of the positioned substrate, comprising plural part supply portions for accommodating a plurality of electronic parts, a plurality of suction nozzles disposed on the periphery of a mounting head for sucking an electronic part from a specified part supply portion, and an image recognition portion for recognizing the sucking position of the sucked electronic part, in which the suction nozzle has plural nozzle tip ends for sucking an electronic part, a turret forming the nozzle tip ends in a radial form, a U-rod for holding the turret rotatably about the axial center in the horizontal direction to the substrate and provided rotatably about the axial center in the vertical direction to the substrate, and a guide slidable in the vertical direction by supporting the U-rod.

According to this constitution, the central position of the opening for suction provided at the nozzle tip end for sucking the electronic part is set as the position deviated by a specified amount from the position of the center of rotation of the U-rod, and the part supply position of the electronic part on the part supply portion is predicted from the recognition result obtained from the image recognition portion, and the rotating amount of the U-rod and the positioning position of the part supply portion are controlled so that the central position of the opening for suction and the central position of the electronic part may coincide with each other, so that the central position of the electronic part may be sucked precisely.

BEST MODE OF CARRYING OUT THE INVENTION

Referring now to the drawings, an embodiment of the invention is described in detail below.

Figure 1:
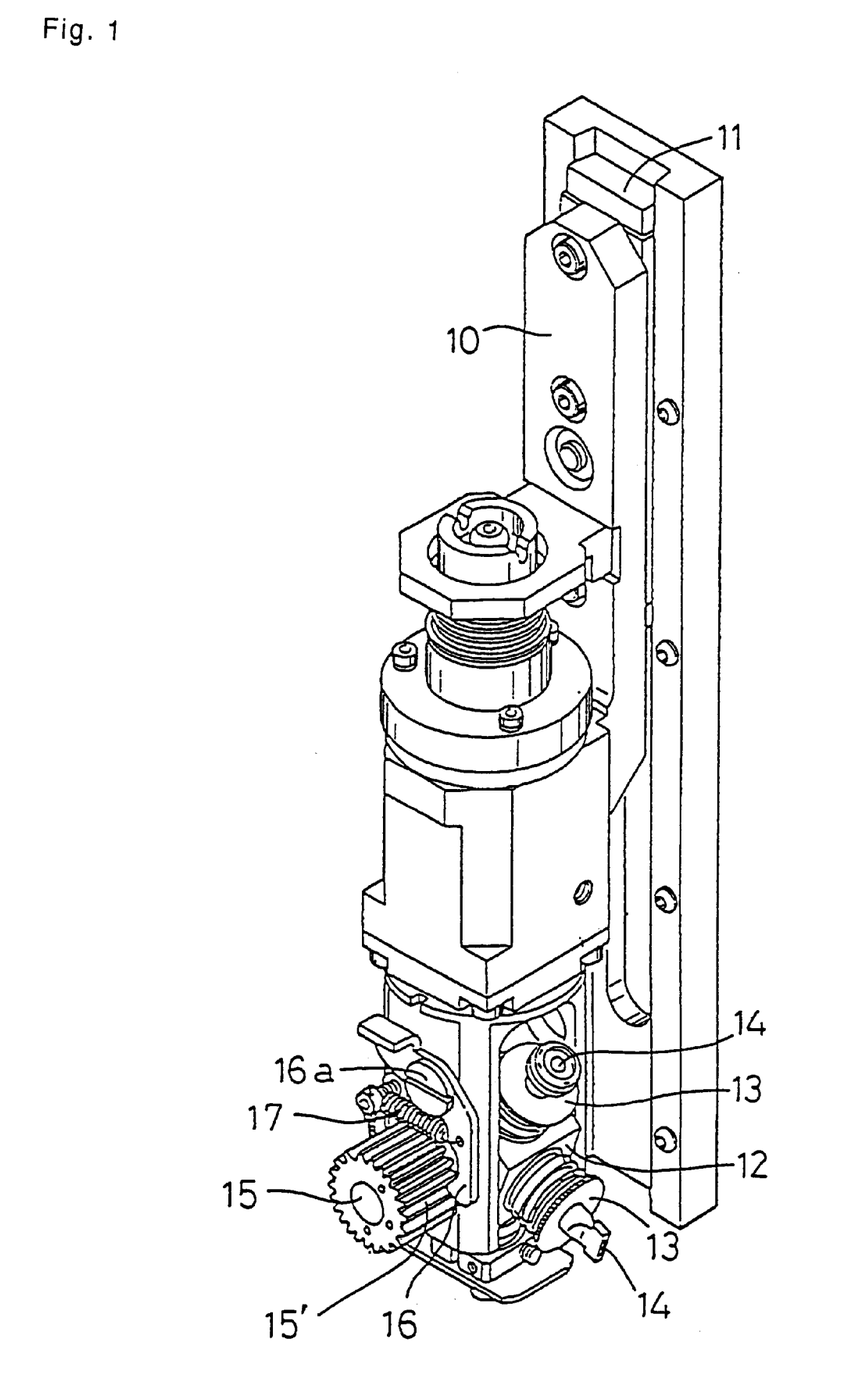
FIG. 1 is a perspective view showing an entire suction nozzle of an electronic part mounting machine in an embodiment of the invention.
Figure 2:
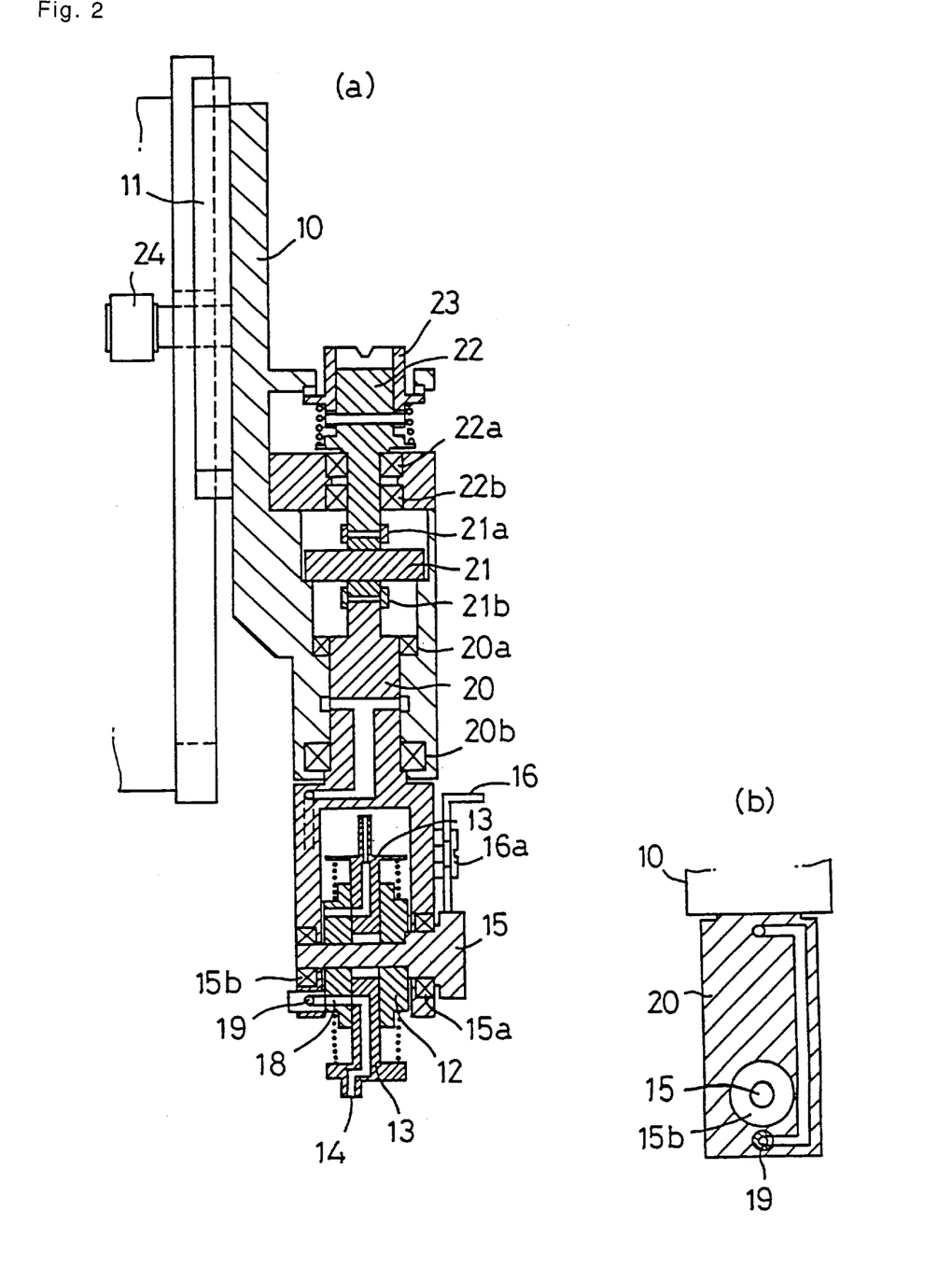
FIG. 2(a) is a sectional view showing the suction nozzle in the embodiment.
FIG. 2(b) is a partial sectional view showing the shape of a first hole of the U-rod.

FIG. 1 is a perspective view showing an entire suction nozzle of an electronic part mounting machine in an embodiment of the invention. In FIG. 1, reference numeral 10 is a suction nozzle, 11 is a guide portion, 12 is a turret portion, 13 is a nozzle tip end, 14 is a suction opening, 15 is a rotating body, 15' is an engaging groove, 16 is an engaging pawl, 16a is a support shaft, and 17 is a spring. FIG. 2(*a*) is a sectional view showing the suction nozzle in the embodiment, and FIG. 2(*b*) is a partial sectional view showing the shape of a first hole of the U-rod. In FIG. 2(*a*), (*b*), reference numerals 15a, 15b are bearings of the rotating body 15, 18 is a second hole, 19 is a first hole, 20 is a U-rod, 20a, 20b are bearings of the U-rod 20, 21 is a reduction gear, 21a, 21b are couplers, 22 is a rotating body, 22a, 22b are bearings of the rotating body 22, 23 is an engaging portion, and 24 is a cam follower.

The constitution of the embodiment of the invention is described below while referring to FIG. 1, and FIG. 2(*a*), (*b*). First, the guide portion 11 for supporting the suction nozzle 10 on the electronic part mounting machine is formed slidably in the vertical direction, and the cam follower 24 to be engaged with an elevating groove cam (not shown) is provided at a specified position of the guide portion 11. Inside of the suction nozzle 10, the rotating body 22 is provided through the bearings 22a, 22b, rotatably about the axial center in the vertical direction to the substrate for mounting electronic parts on. Below the rotating body 22, the U-rod 20 is provided rotatably about the axial center in the vertical direction same as the rotating body 22 through the reduction gear 21 and bearings 20a, 20b.

The rotating body 22 is engaged with the input shaft of the reduction gear 21 and the U-rod 20 is engaged with the output shaft of the reduction gear 21, in the rotating direction by means of the couplers 21a, 21b. At the upper end of the rotating body 22, the V-groove engaging portion 23 is formed corresponding to rotary driving means (not shown).

Below the U-rod 20, the rotating body 15 is provided about the axial center in the horizontal direction to the substrate surface through the bearings 15a, 15b, and the turret portion 12 is engaged with this rotating body 15. The turret portion 12 has a second hole 18 communicating with each nozzle tip end 13, and this second hole 18 communicates with a first hole 19 provided at a specified position of the U-rod 20 only in a selected nozzle tip end 13, thereby forming an air passage. At a specified position of the rotating body 15, an engaging groove 15' is provided for defining the rotation, and an engaging pawl 16 to be engaged with or disengaged from this engaging groove 15' is disposed oscillatably on a support shaft 16a, and also a spring 17 for thrusting the engaging pawl 16 toward the engaging position is provided.

In the suction nozzle 10 of the embodiment having such constitution, the nozzle tip end 13 located at the lowest position of the plural nozzle tip ends 13 as shown in FIG. 2(*a*) is disposed at a position deviated by a specified amount in the central position of the suction opening 14 provided at the nozzle tip end 13, from the position of center of rotation of the U-rod 20, that is, the axial center of rotation of the rotating body 22.

Figure 3:
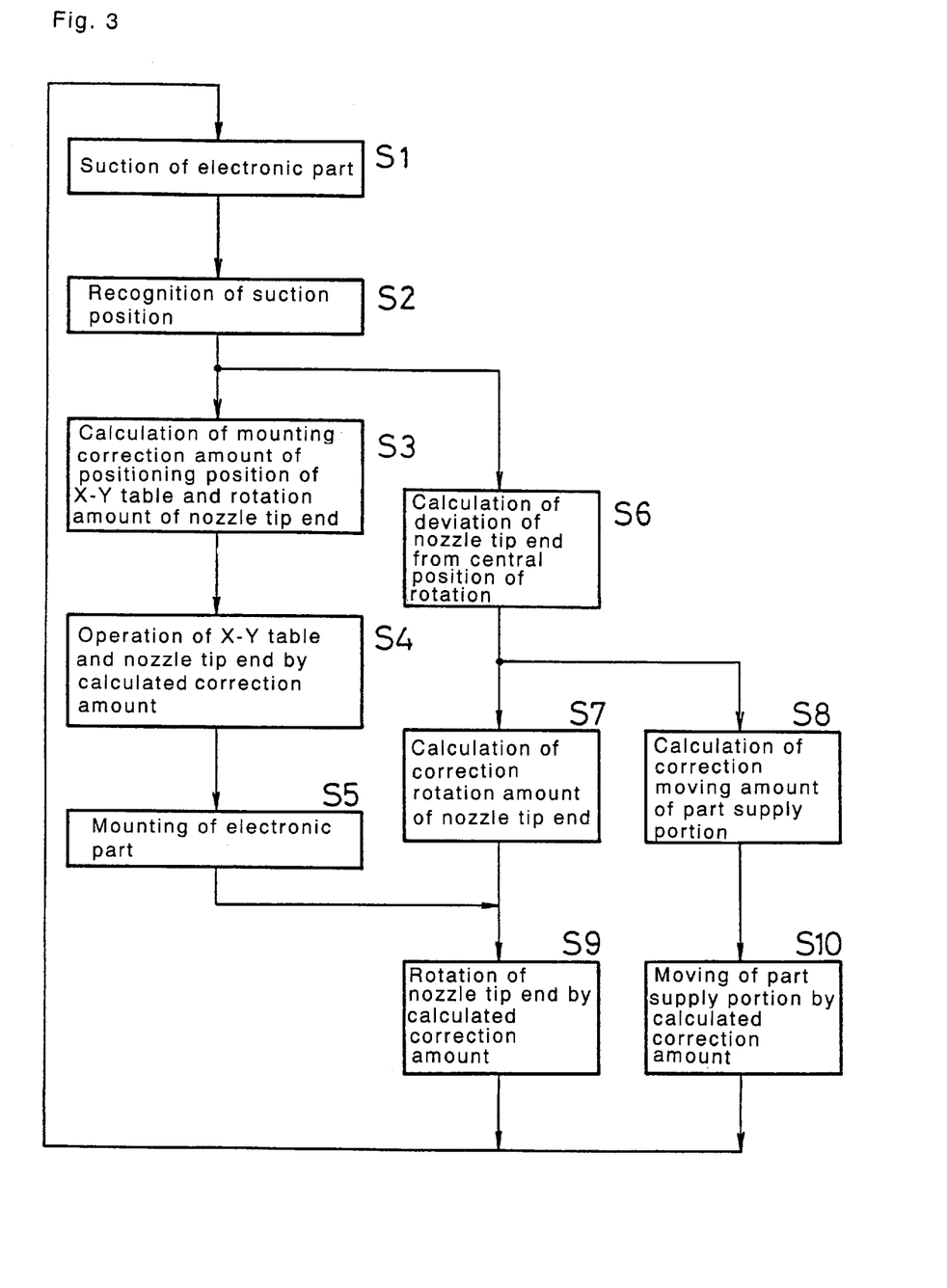
FIG. 3 is a flowchart for explaining the operation for mounting the electronic part in the electronic part mounting machine in the embodiment.

FIG. 3 is a flowchart for explaining the operation for mounting the electronic part in the electronic part mounting machine in the embodiment. Mounting control of electronic part by thus constituted electronic part mounting machine is explained below while referring to FIG. 3. First, the electronic part is sucked at a sucking position of the part supply portion (S1). Then the suction position of the electronic part sucked at the position of the image recognition portion is recognized (S2). Accordingly, in order to mount the sucked electronic part precisely on the substrate, from the recognized suction position of the electronic part, the positioning position of the X-Y table, and each correction amount of rotation amount of the nozzle tip ends (U-rod) are calculated in consideration of the preset mounting position and mounting angle on the substrate (S3). Depending on the calculated data (each correction amount), the X-Y table is moved and the nozzle tip ends are rotated (S4). The electronic part is mounted on the substrate (S5).

On the other hand, simultaneously with the process of the above step S3, the deviation of the central position of the electronic part from the central position of rotation of the nozzle tip end is calculated from the recognized suction position of the electronic part (S6). By thus obtained data (deviation amount), when sucking a next electronic part, in order to suck the central position of the electronic part at the central position of the suction opening of the nozzle tip end, the positioning position of the part supply portion and the correction amount of rotation amount of the nozzle tip end are calculated (S7), (S8). On the basis of these results, the nozzle tip end is rotated by the calculated correction amount obtained at step S7 before the suction operation (S9), and similarly the positioning position of the part supply portion is moved by the calculated correction amount (S10).

Figure 4:
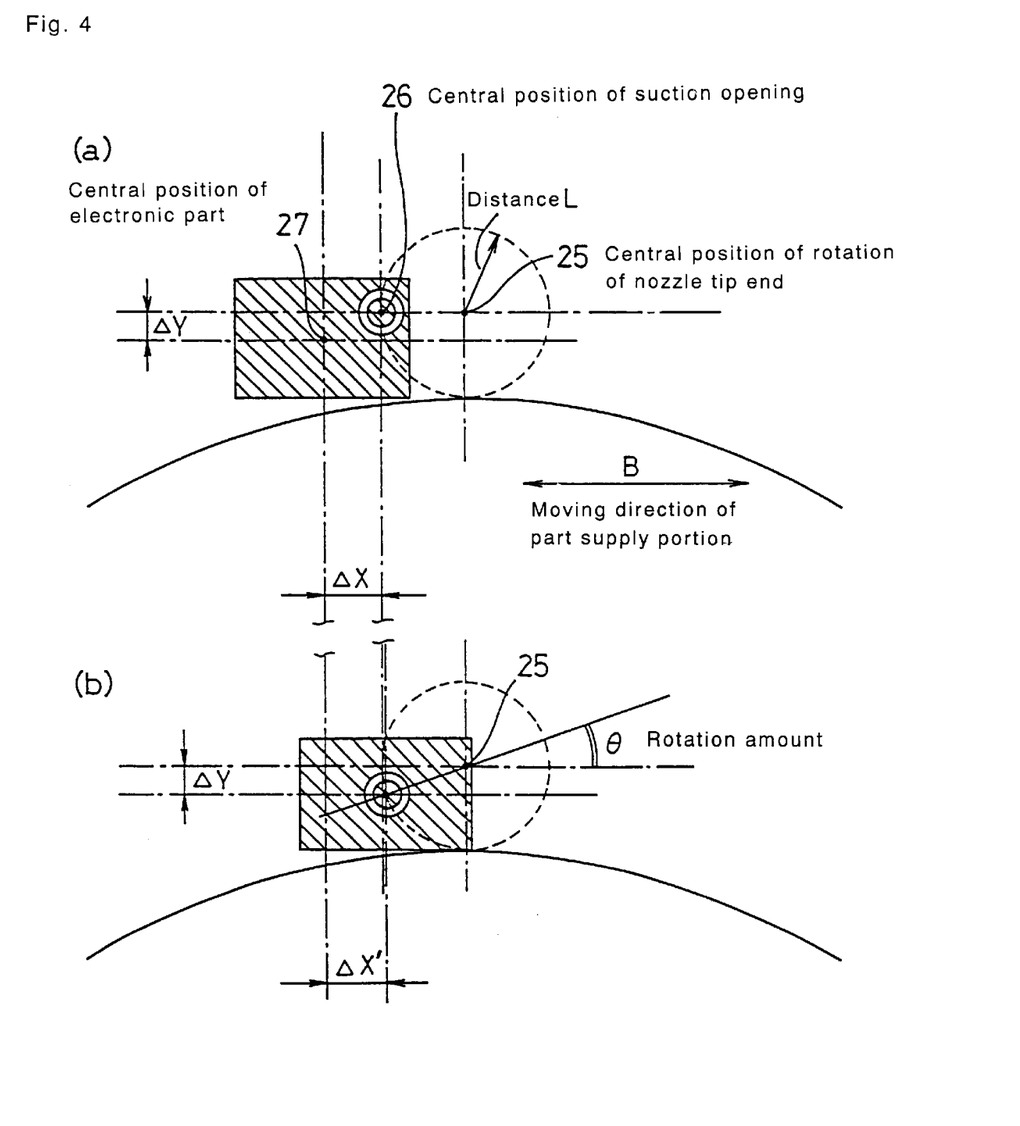
FIG. 4(a) shows an example of configuration of central position of the electronic part and the suction opening provided at the nozzle tip end in the embodiment.
FIG. 4(b) is a plan view showing an example of correction of configuration of central position of the electronic part and the suction opening.

FIG. 4(*a*) shows an example of configuration of central position of the electronic part and the suction opening provided at the nozzle tip end in the embodiment, and FIG. 4(*b*) is a plan view showing an example of correction of configuration of central position of the electronic part and the suction opening. In FIG. 4(*a*), (*b*), reference numeral 25 is the central position of rotation of the nozzle tip end (U-rod), 26 is the central position of the suction opening, 27 is the central position of the electronic part, B is the moving direction of the part supply portion, L is the distance between the central position of rotation of the nozzle tip end and the central position of the suction opening, and $\theta$ is the rotation amount of the nozzle tip end. The central position 26 of the suction opening is the position deviated from the central position of rotation 25 of the nozzle tip end by the distance L, and the part supply portion moves in the direction of arrow B. Referring to FIG. 4(*a*) and (*b*), the detail is described about calculation of the rotation amount of the nozzle tip end and the positioning position of the part supply portion, about the next suction from the specific recognition result.

FIG. 4(*a*) shows the configuration of the electronic part and the central position of the suction tip end before correction of the suction position, and in the initial state, as shown in FIG. 4(*a*), the central position of rotation 25 of the nozzle tip end and the central position 26 of the suction opening at distance L are parallel to the moving direction arrow B of the part supply portion, and the rotation amount $\theta$ of the nozzle tip end at this time is defined to be 0 degree. The central position 26 of the suction opening of the nozzle tip end is deviated from the central position 27 of the electronic part to be sucked by $\Delta X$ in a direction parallel to the moving direction of the part supply portion and by $\Delta Y$ in an orthogonal direction. This configuration can be obtained easily, when recognizing the suction position of the sucked electronic part by the image recognition portion, because the rotation angle of the central position of rotation of the nozzle tip end sucking the electronic part is already known.

In FIG. 4(*b*), each correction amount is added to the rotation amount $\theta$ of the nozzle tip end at the time of suction and the positioning position of the part supply portion, in consideration of the position deviation amount ($\Delta X$, $\Delta Y$). At this time, the rotation amount $\theta$ to be corrected of the nozzle tip end is determined in formula 1, and the moving amount to be corrected of the part supply portion is determined in formula 2.

$$|\theta|=\sin^{-1}(\Delta Y/L) \qquad \text{Formula 1}$$

$$|\Delta X'|=\Delta X+L(1-\cos\theta) \qquad \text{Formula 2}$$

This is the outline of mounting control for sucking the central position of the electronic part precisely, and in actual operation, the inclination and mounting angle when sucking the electronic part are also taken into consideration.

INDUSTRIAL APPLICABILITY

As described herein, according to the invention, the central position of the suction opening provided at the nozzle tip end for sucking the electronic part is deviated from the central position of rotation of the nozzle tip end by a specified amount, and the rotation amount of the nozzle tip end and the positioning position of the part supply portion are controlled, and therefore the central position of the electronic part can be sucked precisely, and the successful suction rate of electronic parts is enhanced.

REFERENCE NUMERALS

1 Mounting head
1a Rotary head
1b, 10 Suction nozzle
2 Part supply portion
2a Drive motor
3 X-Y table
4 X-axis motor
5 Y-axis motor
6 Substrate
7 Image recognition portion
11 Guide
12 Turret
13 Nozzle tip end
14 Suction opening
15 Rotating body
15' Engaging groove
15a, 15b, 20a, 20b, 22a, 22b Bearing
16 Engaging pawl
16a Support shaft
17 Spring
18 Second hole
19 First hole
20 U-rod
21 Reduction gear
21a, 21b Coupler
22 Rotating body
23 Engaging portion
24 Cam follower
25 Central position of rotation of nozzle tip end
26 Central position of suction opening
27 Central position of electronic part

What is claimed is:

1. A method of mounting an electronic part comprising the steps of:
   (a) sucking an electronic part by a suction nozzle, at a positioning position of a part supply portion, with said suction nozzle having a nozzle tip end forming an opening for sucking said electronic part, and a central position of said opening being deviated from a center of rotation of said nozzle tip end by a specified amount,
   (b) recognizing a suction position of said electronic part being sucked,
   (c) calculating a mounting correction amount of both positioning position of X-Y table and rotation amount of nozzle tip end,
   (d) moving said X-Y table according to said calculated mounting correction amount,
   (e) rotating said nozzle tip end according to said calculated mounting correction amount,
   (f) calculating a deviation between a central position of rotation of said nozzle tip end and a central position of said electronic part, on a basis of the recognized suction position,
   (g) calculating a position correction amount of said positioning position of said part supply portion and rotation correction amount of said rotation amount of said nozzle tip end, on a basis of said calculated deviation amount,
   (h) rotating said nozzle tip end by a portion of said calculated rotation correction amount,
   (i) moving said part supply portion by a portion of said calculated position correction amount, and
   (j) mounting said sucked electronic part on a substrate.

2. The method of claim 1,
   wherein said suction nozzle includes:
      a plurality of nozzle tip ends,
      a turret supporting said plurality of nozzle tip ends in a radial form, and
      a U-rod for holding said turret rotatably about an axial center in a horizontal direction to said substrate and provided rotatably about an axial center in a vertical direction to said substrate, and
   said central position of said opening is deviated from a central position of rotation of said U-rod by a specified amount.

3. The method of claim 1, further comprising:
   a step of predicting a part supply position of said electronic part on said part supply portion on a basis of said recognized suction position, and matching said central position of said opening with a central position of said electronic part being sucked.

4. The method of claim 1,
   wherein a distance between said central position of rotation of said nozzle tip end and a central position of said opening is L,
   a rotation angle of said nozzle tip end is $\theta$,
   a distance between said central position of said opening of said nozzle tip end and said central position of said electronic part being sucked is $\Delta X$ in a direction parallel to a moving direction of said part supply portion, and $\Delta Y$ in a direction at right angle to a moving direction of said part supply portion,
   a deviation amount between a central position of rotation of said nozzle tip end and the central position of said electronic part is $\Delta X'$, and in this condition, said nozzle tip end is rotated and said part supply portion is moved so that the following relations are established:

$$|\theta|=\sin^{-1}(\Delta Y/L),$$

and $$|\Delta X'|=\Delta X+L(1-\cos\theta).$$

5. An electronic part mounting machine for mounting an electronic part at a specified position on a substrate, comprising:

a part supply portion for accommodating an electronic part, a suction nozzle for sucking said electronic part from said part supply portion, and an image recognition portion for recognizing a sucking position of said electronic part, wherein said suction nozzle has a nozzle tip end forming an opening for sucking said electronic part, and a central position of said opening is deviated from a center of rotation of said nozzle tip end by a specified amount.

6. The electronic part mounting machine of claim 5, wherein said suction nozzle includes:
- a plurality of nozzle tip ends,
  - a turret supporting said plurality of nozzle tip ends in a radial form, and
  - a U-rod for holding said turret rotatably about an axial center in a horizontal direction to said substrate and provided rotatably about an axial center in a vertical direction to said substrate, and said central position of said opening is deviated from a central position of rotation of said U-rod by a specified amount.

7. The electronic part mounting machine of claim 5, wherein said image recognition portion further has a function of predicting a part supply position of said electronic part on said part supply portion on a basis of result of recognition, matching said central position of said opening with a central position of said electronic part being sucked.

8. The electronic part mounting machine of claim 5, wherein a distance between said central position of rotation of said nozzle tip end and a central position of said opening is L, a rotation angle of said nozzle tip end is θ, a distance between said central position of said opening of said nozzle tip end and said central position of said electronic part being sucked is ΔX in a direction parallel to a moving direction of said part supply portion, and ΔY in a direction at right angle to a moving direction of said part supply portion, a deviation amount between a central position of rotation of said nozzle tip end and a central position of said electronic part is ΔX', and in this condition, the following relations are established:

$$|\theta|=\sin^{-1}(\Delta Y/L),$$

and $$|\Delta X'|=X+L(1-\cos\theta).$$

9. An electronic part mounting machine for correcting a position of suction of an electronic part and mounting said electronic part at a specified position of a positioned substrate, comprising:

a plurality of part supply portions for accommodating a plurality of electronic parts, a plurality of suction nozzles disposed on a periphery of a mounting head for sucking an electronic part from a specified part supply portion, and an image recognition portion for recognizing a sucking position of a sucked electronic part, wherein said suction nozzle has a plurality of nozzle tip ends for sucking an electronic part, a turret forming said nozzle tip ends in a radial form, a U-rod for holding said turret rotatably about an axial center in a horizontal direction to said substrate and provided rotatably about an axial center in a vertical direction to said substrate, and a guide slidable in a vertical direction by supporting said U-rod, thereby a central position of an opening for suction provided at the nozzle tip end for sucking the electronic part is set as a position deviated by a specified amount from a position of a center of rotation of the U-rod.

10. The electronic part mounting machine of claim 9, wherein a part supply position of the electronic part on a part supply portion is predicted from a recognition result obtained from the image recognition portion, and the central position of the opening for suction provided at the nozzle tip end coincides with the central position of the electronic part to be sucked.

* * * * *